US006835416B2

United States Patent
Kilpi

(10) Patent No.: US 6,835,416 B2
(45) Date of Patent: Dec. 28, 2004

(54) APPARATUS FOR GROWING THIN FILMS

(75) Inventor: Vaino Kilpi, Espoo (FI)

(73) Assignee: ASM International N.V., Bilthoven (NL)

( * ) Notice: Subject to any disclaimer, the term of this patent is extended or adjusted under 35 U.S.C. 154(b) by 132 days.

(21) Appl. No.: 10/365,926

(22) Filed: Feb. 13, 2003

(65) Prior Publication Data

US 2003/0140854 A1 Jul. 31, 2003

Related U.S. Application Data

(62) Division of application No. 09/749,339, filed on Dec. 27, 2000, now Pat. No. 6,551,406.

(30) Foreign Application Priority Data

Dec. 28, 1999 (FI) .............................................. 19992797

(51) Int. Cl.$^7$ .......................... C23C 16/00; C23C 16/455
(52) U.S. Cl. ................ 427/255.28; 427/294; 427/248.1
(58) Field of Search .......................... 427/248.1, 255.28, 427/294; 118/715, 724, 725, 728–730; 204/298.15; 156/345.51; 211/41.18; 206/454, 832, 833, 710–713

(56) References Cited

U.S. PATENT DOCUMENTS

| 4,058,430 A | 11/1977 | Suntola et al. ............... 156/611 |
| 4,389,973 A | 6/1983 | Suntola et al. ............... 118/725 |
| 4,522,149 A | 6/1985 | Garbis et al. ............... 118/725 |
| 4,582,720 A | 4/1986 | Yamazaki .................... 427/38 |
| 4,651,673 A | 3/1987 | Muething .................... 118/725 |
| 4,694,779 A | 9/1987 | Hammond et al. ......... 118/730 |
| 4,747,367 A | 5/1988 | Posa ........................... 118/715 |
| 4,823,736 A | 4/1989 | Post et al. .................... 118/730 |
| 4,993,360 A | 2/1991 | Nakamura .................... 118/50 |
| 5,092,728 A | 3/1992 | Crabb et al. ................. 414/217 |
| 5,288,327 A | 2/1994 | Bhat ........................... 118/719 |
| 5,525,159 A | 6/1996 | Hama et al. ............... 118/723 I |
| 5,628,828 A | 5/1997 | Kawamura et al. ......... 118/719 |
| 5,810,538 A | 9/1998 | Ozawa et al. ............... 414/217 |
| 5,855,680 A | 1/1999 | Soininen et al. ............. 118/719 |
| 5,879,459 A | 3/1999 | Gadgil et al. ............... 118/715 |

(List continued on next page.)

FOREIGN PATENT DOCUMENTS

| JP | 3-60027 | 3/1991 |
| JP | 2001-240972 | 9/2001 |

OTHER PUBLICATIONS

Leskela et al. Ale Precursor: Chemistry: Evolution and Future Challenges. Journal de Physique IV, France 9 (1999). 8–837 to 8–852.

(List continued on next page.)

Primary Examiner—Jeffrie R. Lund
(74) Attorney, Agent, or Firm—Knobbe, Martens, Olson & Bear, LLP.

(57) ABSTRACT

An apparatus for growing thin films by exposing the substrate to alternately repeated surface reactions of vapor-phase reactants. The apparatus comprises a reaction chamber including a reaction space, infeed means connected to the reaction space for feeding into the reaction space the reactants, and outfeed means connected to the reaction space for discharging waste gases. At least one substrate is adapted into the reaction space and a second surface is also adapted into the reaction space in a disposition opposed to the surface of the substrate. The thin-film growth supporting surface of the substrate and the other surface disposed opposing the same are arranged in the reaction chamber so as to subtend an angle opening in the flow direction of the reactants in relation to the opposed surfaces. The distance between the opposed surfaces at the infeed end of reactants is smaller than at the gas outfeed end.

7 Claims, 3 Drawing Sheets

U.S. PATENT DOCUMENTS

| | | | |
|---|---|---|---|
| 5,944,904 A | 8/1999 | Jackson | 118/728 |
| 6,015,590 A | 1/2000 | Suntola et al. | 427/255.23 |
| 6,093,253 A | 7/2000 | Lofgren et al. | 118/725 |
| 6,104,002 A | 8/2000 | Hirose et al. | 219/390 |
| 6,159,287 A | 12/2000 | Solomon et al. | 117/101 |
| 6,214,116 B1 | 4/2001 | Shin | 118/640 |
| 6,447,607 B2 | 9/2002 | Soininen et al. | 117/200 |
| 6,551,406 B2 * | 4/2003 | Kilpi | 118/728 |
| 2001/0014371 A1 | 8/2001 | Kilpi | 427/255.28 |
| 2003/0140854 A1 * | 7/2003 | Kilpi | 118/715 |

OTHER PUBLICATIONS

Niinsto et al. Synthesis of Oxide thin Film and Overlayers by Atomic Layer Epitaxy for Advanced Applications. Materials Science and Engineering B41 (1996). pp. 23–29.

Santola, Tuomo. Atomic Layer Epitaxy. Thin Solid films, 216 (1992), pp. 84–89.

* cited by examiner

APPARATUS FOR GROWING THIN FILMS

PRIORITY INFORMATION

This application is a divisional of U.S. patent application Ser. No. 09/749,339, filed on Dec. 27, 2000, now U.S. Pat. No. 6,551,406, which claims the priority benefit under 35 U.S.C. §119 to Finnish Patent Application No. 19992797, filed Dec. 28, 1999, the entire content of these applications is hereby expressly incorporated by reference.

FIELD OF THE INVENTION

The present invention relates to an apparatus for growing thin films on a surface of a substrate. More particularly, the present invention relates to an apparatus for producing thin films on a surface of a substrate by subjecting the substrate to alternately repeated surface reactions of vapor-phase reactants.

DISCUSSION OF RELATED ART AND SUMMARY OF THE INVENTION

Conventionally, thin-films are grown using vacuum evaporation deposition, the Molecular Beam Epitaxy (MBE) and other similar vacuum deposition methods, different variants of the Chemical Vapor Deposition (CVD) method (including low-pressure and organometallic CVD and plasma-enhanced CVD) or a deposition method of alternately repeated surface reactions called the Atomic Layer Epitaxy (ALE) or Atomic Layer Deposition (ALD).

In MBE and CVD methods, the thin film growth rate is determined by the concentrations of the provided starting material in addition to other process variables.

To achieve a uniform thickness of the layers deposited by these methods, the concentrations and reactivities of starting materials must be carefully kept constant on different surface areas of the substrate. If the different starting materials are allowed to mix with each other prior to reaching the substrate surface, as is the case in the CVD method, for instance, a chance of their mutual reaction arises. Then, a risk of microparticle formation already within the infeed channels of the gaseous reactants is imminent. Such microparticles generally have a deteriorating effect on the quality of the deposited thin film. Therefore, the possibility of premature reactions in MBE and CVD reactors, for instance, is avoided by heating the starting materials not earlier than at the substrate surfaces. In addition to heating, the desired reaction can be initiated using, e.g., a plasma discharge or other similar activating means.

In the MBE and CVD processes, the growth of thin films is primarily adjusted by controlling the infeed rates of starting materials impinging on the substrate. In contrast, the growth rate in the ALE process is controlled by the substrate surface qualities, rather than the starting material concentrations or flow variables. The only prerequisite in the ALE process is that the starting material is available in sufficient concentration to saturate the surface of the substrate. The ALE method is described, for example, in FI patent publications 52,359 and 57,975 and in U.S. patent publications 4,058,430 and 4,389,973. Equipment constructions suited to implement this method are disclosed in patent publications U.S. Pat. No. 5,855,680 and FI 100,409. Apparatuses for growing thin films are also described in the following publications: Material Science Report 4(7) (1989), p. 261, and Tyhjiötekniikka (Finnish publication for vacuum techniques), ISBN 951-794-422-5, pp. 253–261. These references are incorporated herein by reference.

In the ALE growth method described in FI Pat. No. 57,975, the reactant atoms or molecules are arranged to sweep over the substrates, thus impinging on their surface until a fully saturated molecular layer is formed thereon. Next, the excess reactant and the gaseous reaction products are removed from the substrates with the help of inert gas pulses passed over the substrates or, alternatively, by pumping the reaction space to a vacuum before the next gaseous pulse of a different reactant is admitted. The succession of the different gaseous reactant pulses and the diffusion barriers formed by the separating inert gas pulses or cycles of vacuum pumping result in a thin film growth controlled by the individual surface-chemical reactions of all these components. If necessary, the effect of the vacuum pumping cycle may be augmented by the inert gas flow. For the function of the process, it is typically irrelevant whether the gaseous reactants or the substrates are kept in motion; it only matters to keep the different reactants of the successive reactions separate from each other and to have them sweep successively over the substrate.

Most vacuum evaporators operate on the so-called "single-shot" principle. Hereby, a vaporized atom or molecule can impinge on the substrate only once. If no reaction with the substrate surface occurs, the atom/molecule is rebound or revaporized so as to hit the apparatus walls or the vacuum pump, undergoing condensation therein. In hot-walled reactors, an atom or molecule that collides with the process chamber wall or the substrate can undergo revaporization and, hence, repeated impingements on the substrate. When applied to ALE process chambers, this "multi-shot" principle can offer a number of benefits including improved efficiency of material consumption.

ALE reactions operating on the "multi-shot" principle generally are designed for the use of a cassette unit in which a plurality of substrates can be taken simultaneously into the process chamber or, alternatively, the substrates can be placed unmountedly into the process space formed by a pressure vessel, whereby the process space also serves as the reaction chamber wherein the vapor-phase reactants are reacted with the substrate surface in order to grow thin film structures. If a cassette unit designed for holding several substrates is employed, the reaction chamber is formed in the interior of the cassette unit. Use of a cassette unit shortens the growth time per substrate in respect to single-substrate cycling, whereby a higher production throughput is attained. Furthermore, a cassette unit arranged to be movable into and out from the process chamber can be dismantled and cleaned without interrupting the production flow because one cassette unit can be used in the process chamber while another one is being cleaned.

Batch processing is preferred in conventional ALE thin film processes because of the relatively slow production pace of the ALE method relative to other thin film growth techniques. The overall growth time per substrate of a thin film structure can be reduced in a batch process to a more competitive level. For the same reason, larger substrate sizes are also preferred.

In one embodiment of the ALE technique, the framework of the cassette unit is formed by a holder box made from titanium, for instance, having a structure with open top and bottom ends, whereby the holder box can support a plurality of substrates inserted therein into a longitudinally parallel position. The substrates have their ends or perimeters mounted in frames that are further placed into grooves formed at opposite ends of the substrate holder box. Each substrate frame has two substrates mounted therein with the back sides of the substrates facing each other. Herein, the back side of a substrate refers to that face of the substrate on which no thin film is to be grown. The access of reactants into any space that remains between the back sides of the substrates is prevented by covering the longitudinal top and bottom edges of the substrates with protecting continuous seal sections. The reactants and the inert gas are passed into the holder box via the infeed holes of the parallel infeed channels of a sprayhead manifold located above the holder box. Of course, the sprayhead construction may be varied as required. The excess reactants and reaction gases are removed from the holder box via discharge channels of a suction box connected to, at the bottom part of the holder box. In this manner, the gases are forced to flow through the spaces remaining between the faces of the substrates on which a thin film is to be grown.

Feeding the gaseous reactants into the holder box from one end only may cause stronger film growth on substrate surface areas located closer to the infeed of reactants. In order to compensate for this effect, the gases can be fed onto the substrates alternately from opposite directions. In such an arrangement, the exhaust suction through the outfeed channel are typically arranged to also take place alternately at opposite ends. Due to the alternating infeed cycles, infeed/discharge nozzles must be located at both the top and bottom ends of the holder box, which complicates the construction substantially.

It is therefore an object of the present invention to provide a novel type of ALE reaction chamber featuring improved reactant flow conditions over those known in the art, whereby a smooth thin film growth is obtained on the substrate surface.

Accordingly, one aspect of the invention involves placing the substrates in a substrate holder box of a cassette unit longitudinally side-by-side in an A-shape inclined disposition with their back sides facing each other so that the distance between the opposed surfaces, which are intended to support the thin film growth and between which the gases are arranged to flow, is narrower at the gas infeed end than at the gas outfeed end. In other words, the A-shape inclined disposition of the opposed surfaces being deposited with a thin film opens in the flow direction of reactant gases, whereby the cross section of the gas flow channel becomes larger in the flow direction and, as a result, the flow speed decreases toward the outfeed end of the substrate holder box. Furthermore, a preferred embodiment of the invention has the parallel reactant infeed channels of the sprayhead manifold adapted to open at least substantially perpendicular to the longitudinal axis of the substrates, whereby the number of substrates laced in the substrate holder box can be varied without changing the distance between the infeed channels.

More specifically, the invention relates to an apparatus that comprises a reaction chamber including a reaction space, infeed means connected to the reaction space for feeding into the reaction space the reactants used in the thin film growth process, and outfeed means connected to the reaction space for discharging excess reactants and gaseous reaction products from the reaction space. At least one substrate is provided within the reaction space and a second surface is opposed to the surface of the substrate on which the thin film is to be grown. The reactants are forced to flow in relation to the opposed surfaces in the space formed therebetween. The thin-film growth supporting surface of the substrate and the surface disposed opposing the same are arranged into the reaction chamber so as to subtend an angle opening in the flow direction of the reactants in relation to the opposed surfaces, whereby the distance between the opposed surfaces and the infeed end of reactants is smaller than at the gas outfeed end.

The invention offers significant benefits. For example, by placing the substrates in an A-shape inclined disposition opening in the flow direction of the reactants and the reaction gases, the thin film grown on the substrate surfaces becomes more uniform than what is obtained through a constant spacing between the substrates and more uniform than what is obtained by locating the substrate surfaces intended to support the thin film growth into an A-shape opposed disposition so that the gas flow is restricted as it flows toward the closing apex.

If the sprayhead serving for the infeed of reactants and inert gases is located at the top of the cassette unit, a pair of substrates with their back sides opposing each other will be disposed in a single substrate frame so as to form an inverted letter A. When the substrate frames are then placed in the holder box, they will fit tightly by their own weight against the upward walls in the V-shape aligned grooves made in the ends of the substrate holder box. The accurate placement of the substrates prevents any gas flow from escaping to the back sides of the substrates.

To avoid intermixing of reactants, it is preferable to keep the infeed channels of the different reactants separate from each other as long as possible. In prior-art constructions, the infeed channels of reactants and inert gas have been arranged to open into the cassette unit in the direction of the longitudinal axes of the substrates, whereby any change in the batch of substrates to be processed has also required changes in the distance or number of infeed channels in order to provide gas flow into all the spaces between the substrate surfaces on which a thin film is to be grown. In the preferred embodiment of the invention, the infeed channels of the sprayheads are located at right angles to the longitudinal axes of the substrates, whereby the number of substrates placed in the cassette unit can be varied without altering the distance between the infeed channels or the number thereof.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

It should also be noted that all of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

In the following, the invention will be described in greater detail with the help of exemplifying embodiments illustrated in the appended drawings, in which.

DETAILED DESCRIPTION OF THE PREFERRED EMBODIMENT

Figure 1:
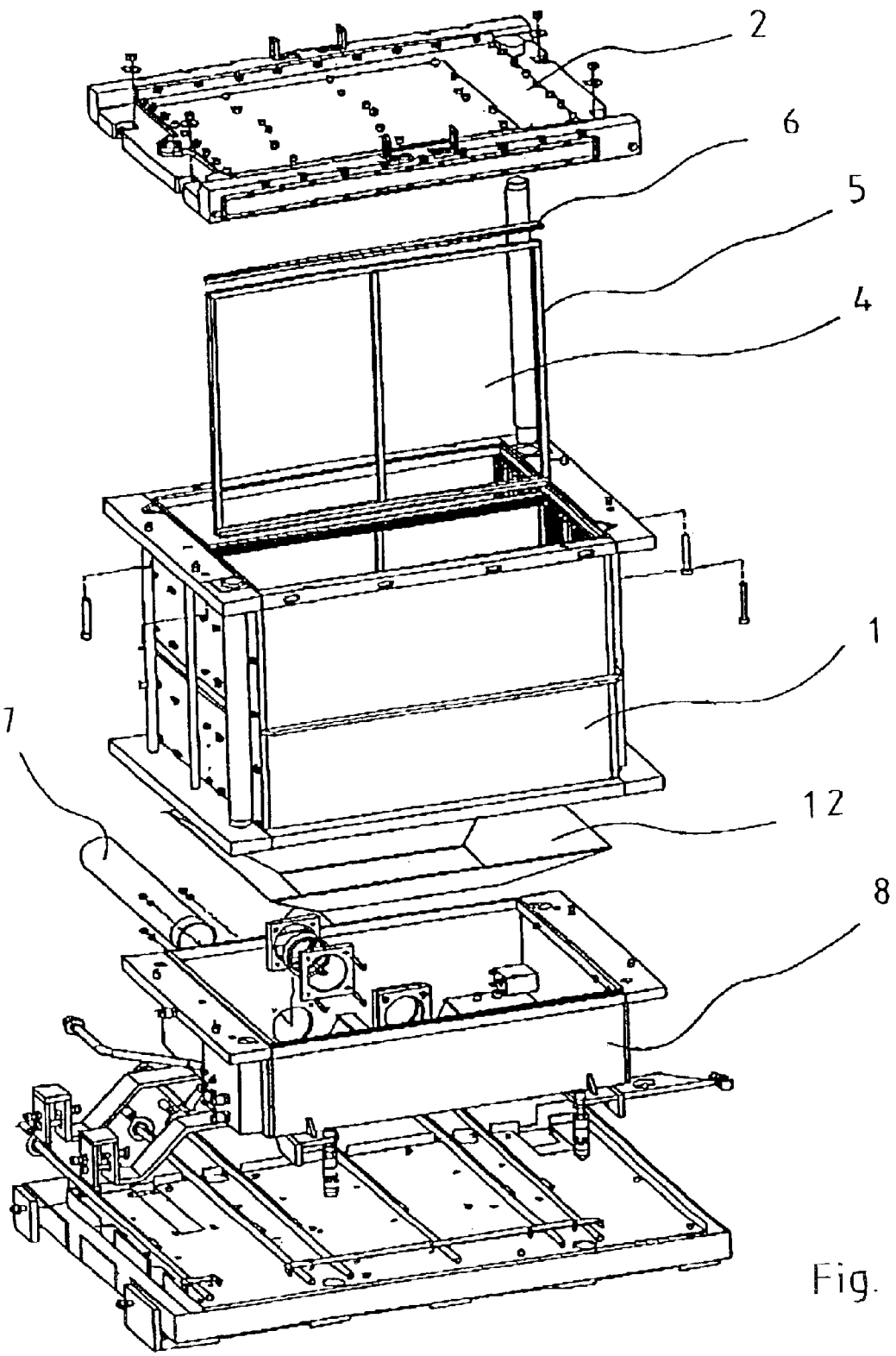
FIG. 1 is an exploded view of an apparatus for growing thin films onto the surface of a substrate having certain features and advantages according to the present invention.

In the context of the present invention, the term "reactant" refers to a gas or a vaporizable solid or liquid starting material capable of reacting with the surface of the substrate. The ALE method conventionally uses reactants selected from two separate groups. The term "metallic reactants" is used of metallic compounds which may even be elemental metals. Suitable metallic reactants are the halogenides of metals including chlorides and bromides, for instance, and organometallic compounds such as the thd complex compounds. The following are examples of metallic reactants that can used Zn, $ZnCl_2$, $Ca(thd)_2$, $(CH_3)_3Al$ and $Cp_2Mg$. The term "nonmetallic reactants" is used for compounds and elements capable of reacting with metallic compounds. The latter group is appropriately represented by water, sulfur, hydrogen sulfide and ammonia.

In the present context, the term "protective gas" is used when reference is made to a gas which is admitted into the reaction space and is capable of preventing undesired reactions related to the reactants and, correspondingly, the substrate. Such reactions include, for example, the reactions of reactants and the substrate with possible impurities. The protective gas also serves to prevent reactions between substances of different reactant groups in, for example, the infeed piping. In the method according to the invention, the protective gas is also preferably used as the carrier gas of the vapor-phase pulses of the reactants. According to a preferred embodiment, in which reactants of different reactant groups are admitted via separate infeed manifolds into the reaction space, the vapor-phase reactant pulse is admitted from one infeed channel while the protective gas is admitted from another infeed channel thus preventing admitted reactants from entering the reactant infeed channel of another reactant group. Examples of suitable protective gases are inert gases such as nitrogen and noble gases, for example, argon. The protective gas may also be an inherently reactive gas such as hydrogen gas selected to prevent undesirable reactions (e.g., oxidization reactions) from occurring on the substrate surface.

According to the invention, the term "reaction chamber" includes both the reaction space in which the substrate is located and in which the vapor-phase reactants are allowed to react with the substrate in order to grow thin films, as well as the gas infeed/outfeed channels communicating immediately with the reaction space. These channels serve to admit the reactants into the reaction space (infeed channels) or to remove the gaseous reaction products and excess reactants of the thin-film growth process from the reaction space (outfeed channels). A substrate located in this kind of reaction chamber is subjected to alternately repeated surface reactions of at least two different reactants used for producing a thin film. The vapor-phase reactants are preferably admitted repetitively and alternatingly, with each reactant preferably being fed separately from its own source into the reaction chamber, where they are allowed to react with the substrate surface for the purpose of forming a solid-state thin film product on the substrate. Reaction products that have not adhered onto the substrate, and any possible excess reactant, are removed from the reaction chamber in the vapor phase.

Herein, the term "substrate surface" is used to denote that surface of the substrate onto which the vapor-phase reactant flowing into the reaction chamber impinges. In practice, the surface, during the first cycle of the thin-film growing process is constituted by the surface of a substrate such as glass or semi conductor wafer, for instance, or some other starting surface. During the second cycle, the surface is constituted by the layer formed during the first cycle and comprising the solid-state reaction product which is deposited by the reaction between the reactants and is adhered to the substrate, etc.

The term "process chamber" is used when reference is made to the space in which the thin film growth process is carried out and which is preferably isolated from its environment in a tightly sealable manner. The reaction chamber is located in the process chamber and, further, a single process chamber may incorporate a plurality of reaction chambers.

Figure 2:
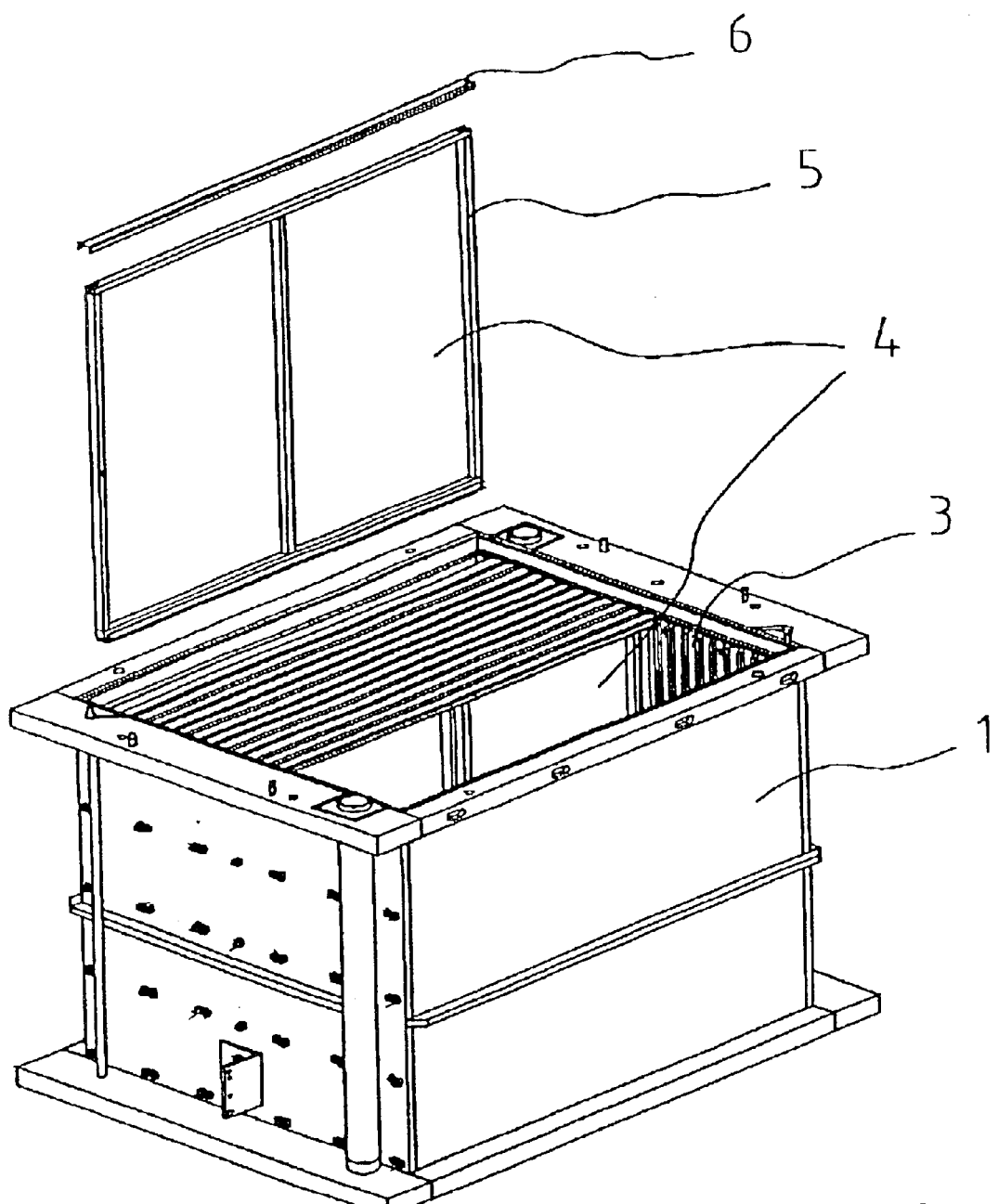
FIG. 2 is a more detailed view of a substrate holder box of the apparatus depicted in FIG. 1.
Figure 3:
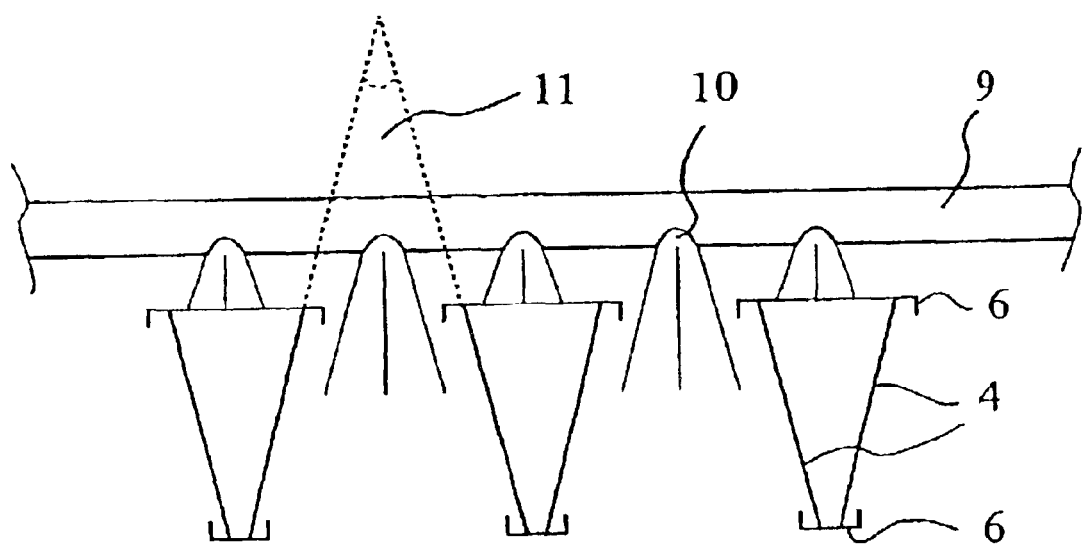
FIG. 3 is a schematic cross-sectional layout view of substrates placed in parallel frames.

FIGS. 1–3 illustrate an ALE apparatus for growing thin films onto the surface of a substrate having certain features and aspects according to the present invention. FIGS. 1 and 2 illustrate a portion of the process chamber including the reaction chamber, which includes a cassette unit 1 acting as the reaction space and a sprayhead 2. The sprayhead 2 includes the reactant and the protective gas infeed channels and is attachable to the top of reaction chamber. Preferably, the cassette unit 1 is made from titanium and preferably incorporates at its both inner ends fastening means such as grooves 3. A support flame element 5 is preferably adapted between each pair of substrates 4, to both ends thereof. Preferably, on each support frame element 5 are mounted two substrates 4 with their back sides facing each other. Here, the term substrate back side refers to that face of the substrate 4 on which no thin film is to be grown. The back sides of the opposed substrates 4 may be abutting each other, spaced apart from each other by a gap or, in a modified arrangement, a temperature equalizing or actively heated spacer plate may be inserted between them. The top and bottom edges of substrates 4 placed in the same support frame element 5 are preferably covered by a continuous seal section 6 serving to inhibit gases from reaching into any space remaining between the back sides of the opposed substrates 4. The substrates 4 mounted with their back sides opposed to each other in the support frame element 5 are placed in grooves 3 made in the cassette unit 1.

The entity formed by the sprayhead 2, the cassette unit 1 with the substrates 4, the support frame elements 5 and the continuous seal sections 6 can be moved as such outside the process chamber. The cassette unit 1 is preferably mounted into the process chamber on a preferably permanently fixed suction box 8 that incorporates gas outfeed channels 7, whereby the cassette unit 1, the sprayhead 2 and the suction box 8 form the reaction chamber of the ALE apparatus. The reactants and the inert gas are passed into the reaction chamber via the parallel manifold channels of the sprayhead 2. Of course, other constructions of the sprayhead 2 can be used. The gas flow travels toward the suction box 8 along the flow channels formed by opposed substrate surfaces ("front side") on which the thin film is being deposited. The gas flow exits the reaction chamber via the outfeed channels 7 of the suction box 8. To augment the gas flow, a funnel-like gas flow guide 12 can be mounted between the cassette unit 1 and the suction box 8. The illustrated flow guide 12 has a flow channel cross section that tapers toward the suction box 8.

Thermal expansion movements of the suction box 8 and the cassette unit 1 may impose thermal stresses on the suction box 8 if the same is supported on the process chamber by, for example, its edges. The amplitude of the thermal expansion displacements may be as large as up to several millimeters. Such displacements can cause problems, for example, in the placement of the cassette unit 1 into the process chamber during automatic loading and unloading. Hence, the suction box 8 is preferably supported on the process chamber walls so that the center point of the support arrangement at least preferably coincides with the center point of the bottom of the suction box 8, whereby the suction box 8 has greater freedom to expand outward from its support point and the position of the cassette unit 1 becomes more stable.

Preferably, the gas infeed and outfeed channels are made to the cassette unit 1 (which can be moved into and out from the process chamber) and the sprayhead 2 is connected to the corresponding channels of the process chamber and the suction box 8 using, for example, accurately aligned and honed flange surfaces. The sprayhead 2 forms a cover over the substrates 4 that protects the substrate surfaces 4 from dust particles during the time the cassette unit 1 is apart from the suction box 8. The sprayhead 2 also prevents the gas that is heated in the space between the hot substrates 4 from rising upward and thus causing carry-over of entrained detrimental particulate matter therewith.

As shown in the cross-sectional view of FIG. 3, the substrates 4 are mounted by their ends on support frame elements that are placed in grooves made to the ends of the substrate holder box. Each support frame element has two substrates 4 placed therein with the substrate back sides facing each other. The top and bottom edges of substrates 4 placed in the same support frame element are covered with continuous seal sections 6 that prevent gases from passing into the space remaining between the substrates 4 adapted in the same support frame element. In the illustrated arrangement, above the substrates 4, preferably at least substantially perpendicular to their longitudinal axes, there are adapted parallel infeed channels 9 of the sprayhead 2, whereby reactants and inert gas can be introduced from the discharge openings 10 of the infeed channels 9. The gases can be injected either directly into the flow channels, formed between the thin-film growth supporting surfaces of the substrates 4 placed opposing each other in adjacent support frame elements or, in a modified arrangement, first impinging on the continuous seal sections 6 covering the top edges of the substrates 4, whereby the flow pattern will be equalized by the continuous seal section 6.

The substrates 4 are placed in an A-shape inclined disposition so that the cross section of the gas flow introduced from the infeed channels 9 widens downwardly toward the suction box 8 and the gas outfeed channels 7. Accordingly, the distance between the opposed substrate surfaces which are intended to support the thin film growth is narrower at the reactant feed end than at the outfeed end of the flow channel. Preferably, the angle 11 subtended between the thin-film growth supporting surfaces of the opposed substrates 4 is in the range 0–10°, for small-height substrates even larger. The gap between the opposed thin-film growth supporting surfaces at the gas infeed end is preferably about 4–8 mm and at the gas outfeed end, preferably about 5–20 mm for processing substrates 4 having a height of about 500 mm.

In the ALE method, the reactant atoms or molecules are typically allowed to sweep over the substrates 4 impinging on the substrate front side surfaces intended to support the thin film growth until a fully saturated molecular layer is formed thereon. Next, the excess reactant and the gaseous reaction products are typically removed from the substrates 4 with the help of passing inert gas pulses thereover or using vacuum pumping prior to the introduction of the next gaseous pulse of a different reactant. The different reactant gaseous pulses, together with the diffusion barriers formed therebetween by inert gas pulses or vacuum pumping cycles, accomplish the desired thin film growth at a rate controlled by the surface chemistry properties of the different materials. If necessary, the effect of the vacuum pumping cycle can be augmented by introducing an inert gas pulse. However, it should be appreciated that for the function of the process, the substrates 4 can instead be moved. In such an arrangement, it is preferable to have the different reactants of the successive reaction steps separated from each other and arranged to sweep over thin-film growth supporting surfaces of the substrates 4 in a sequential manner. Of course, to perform the above-described processes, the illustrated apparatus preferably includes a suitably configured controller.

Although the thin film growth process according to the ALE method is inherently insensitive to such factors as a homogeneous gas flow or concentrations of reactant starting materials, it is preferable to provide at any time a sufficient starting material concentration to support uniform thin film growth at any point of the surface of the substrate 4. When the reactants flow between the thin-film growth supporting surfaces of the substrates 4 and react with these surfaces of the substrates 4, the relative concentration of reactant in the gas flow decreases and, simultaneously, the concentration of reaction gases released in the reactions increases. Hence, it would appear natural to those skilled in the art to place the substrates in an A-shape inclined disposition so that the flow channel cross section in the travel direction of the reactants and reaction gases would become narrower toward the outfeed end of the cassette unit 1 in order to assure that the decreasing amounts of reactants would impinge with a higher probability of incidence on the surfaces of the substrates 4. However, in the embodiment according to the invention it is preferred to reverse the inclination angle of the A-shape disposition of the substrates 4 because this arrangement has been found to improve the surface profile smoothness on the substrates 4. While the exact background to this unexpected outcome is still unknown, the reason may be traced to either the longer reaction time made possible by the retarded gas flow velocity or to some unknown reactions of the reacting components on the substrate surfaces supporting the thin film growth.

Another advantage of the present invention is due to the narrower distance between the opposed thin-film growth supporting surfaces of the substrates 4 at the infeed end of gases. The opposed substrates 4 restrict the gas flow introduced into the reaction chamber so that the flow is divided more evenly at different points into the spaces between the thin-film growth supporting surfaces of the substrates 4.

In addition to those embodiments described above, the invention may include additional embodiments. For example, the suction box 8 may also be designed to form a part of the entity that can be taken out from the process chamber, whereby the infeed and outfeed channels to be connected to the cassette unit 1 are adapted to mate directly with the respective channels of the process chamber.

In the illustrated arrangement, the reactants and the inert gas are arranged to flow from top downward. In a modified arrangement, the flow direction may can be reversed to occur from bottom upward. In such an arrangement, the sprayhead 2 with its infeed channels 9 are preferably located in the bottom part of the cassette unit and, respectively, the suction box 8 with its outfeed channels 7 to the upper part of the cassette unit. Moreover, the A-shape inclined disposition of the substrates 4 are preferably reversed therein. In another modified arrangement, the opposed substrates 4 may be placed so that, for example, the gases flow between the substrates horizontally or inclined at a given angle from the horizontal direction. In such an arrangement, the A-shape inclined disposition of the thin-film growth supporting surfaces of the substrates 4 are preferably aligned so as to form an opening angle in the direction of gas flow.

In yet another modified arrangement, the sprayhead 2, instead of being comprised of a manifold of separate infeed channels 9, may be designed to comprise a single gas volume that has openings or other discharge orifices made thereto for feeding gases into the spaces formed between the thin-film growth supporting surfaces of the substrates 4. Moreover, in yet other arrangements, the edges of the opposed substrates 4 closest to the sprayhead 2 may have, for example, a curved contour, whereby the sprayhead 2 can be designed to have parallel infeed channels 9 placed at different levels so as to make them match better with the curved contours of the edges of the substrates 4.

The illustrated arrangement can also applicable to other process arrangements besides the batch processes described above. For example, the invention can also well be used for growing thin films in single substrate reactors. In such an arrangement, the A-shape inclined disposition can be obtained, for example, by placing the substrate in a facing disposition with another surface (e.g., a chamber wall) so that the thin-film growth supporting surface of the substrate forms an opening angle in the gas flow direction with the other surface. A wall or plate, for example, can serve as the other surface. As mentioned above, the ALE process can also operate with moving substrates. Accordingly, in a modified arrangement, the invention can also be applied such that the movement of substrates in the reaction chamber replaces the reactant gas flow. In such an arrangement, the reactants are forced to move in the spaces formed between the opposed thin-film growth supporting surfaces of the substrates.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Moreover, although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or subcombinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

I claim:

1. A method for growing thin films onto a first surface of a substrate comprising:

supplying vapor phase reactants to a reaction space that is defined at least in part by said first surface and a second surface that faces said first surface;

flowing said vapor phase reactants along a widening passage that is defined at least in part by said substrate and a second surface;

removing excess reactants and gaseous reactant products from said reaction space.

2. The method of claim 1 further comprising impinging said vapor phase reactants onto said first surface until a fully saturated molecular layer is formed on said first surface.

3. The method of claim 2 further comprising impinging said vapor phase reactants onto said second surface until a fully saturated molecular layer is formed on said second surface, which is part of a second substrate.

4. The method of claim 1, wherein removing said excess reactants and gaseous reactant products includes passing an inert gas pulse through said widening passage.

5. The method of claim 1, wherein removing said excess reactants and gaseous reactant products includes applying a vacuum to said widening passage.

6. The method of claim 1, wherein flowing said vapor phase reactants and removing said excess reactants and gaseous reactant products occurs in multiple pulses in which flowing pulses are separated by removing pulses.

7. The method of claim 1, wherein supplying said vapor phase reactants to said reaction space includes injecting said vapor phase reactants over a continuous seal section which cover, a top edge of said first substrate and a top edge of a second substrate that is arranged such that a back side of said second substrate faces a back side of said first substrate.

* * * * *